United States Patent
Arneson et al.

(10) Patent No.: US 7,404,199 B2
(45) Date of Patent: Jul. 22, 2008

(54) METHOD, SYSTEM, AND APPARATUS FOR HIGH VOLUME ASSEMBLY OF COMPACT DISCS AND DIGITAL VIDEO DISCS INCORPORATING RADIO FREQUENCY IDENTIFICATION TAG TECHNOLOGY

(75) Inventors: Michael R. Arneson, Westminister, MD (US); William R. Bandy, Gambrills, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 359 days.

(21) Appl. No.: 10/866,151

(22) Filed: Jun. 14, 2004

(65) Prior Publication Data

US 2004/0251541 A1    Dec. 16, 2004

Related U.S. Application Data

(60) Provisional application No. 60/477,735, filed on Jun. 12, 2003.

(51) Int. Cl.
*G11B 23/00* (2006.01)
(52) U.S. Cl. .................................................. 720/718
(58) Field of Classification Search ................ 720/718, 720/719; 369/14, 100, 273; 359/2; 340/10.41, 340/572.7; 257/678; 438/613
See application file for complete search history.

(56) References Cited

U.S. PATENT DOCUMENTS

| | | | |
|---|---|---|---|
| 3,724,737 A | 4/1973 | Bodnar | |
| 3,891,157 A | 6/1975 | Justus | |
| 3,989,575 A | 11/1976 | Davies et al. | |
| 4,346,514 A | 8/1982 | Makizawa et al. | |
| 4,480,742 A | 11/1984 | Muylle | |
| 4,925,808 A | 5/1990 | Richardson | |
| 5,519,381 A | 5/1996 | Marsh et al. | |
| 5,528,222 A | 6/1996 | Moskowitz et al. | |
| 5,537,105 A | 7/1996 | Marsh et al. | |
| 5,557,280 A | 9/1996 | Marsh et al. | |
| 5,564,888 A | 10/1996 | Doan | |

(Continued)

FOREIGN PATENT DOCUMENTS

DE    196 34 473 C2    1/1998

(Continued)

OTHER PUBLICATIONS

English Language Abstract for DE 19634473, published Jan. 22, 1998, 1 page.

(Continued)

*Primary Examiner*—Tianjie Chen
(74) *Attorney, Agent, or Firm*—Sterne, Kessler, Goldstein & Fox PLLC

(57) ABSTRACT

Methods, systems, and apparatuses for forming a radio frequency identifiable disc medium storage device are described. A metal layer is deposited onto a disc. At least one metal trace on the disc is connected to the metal layer. An adhesive interposer is attached to the disc around an opening in the center of the disc. The interposer includes an integrated circuit die. Pads of the integrated circuit die are coupled to the at least one pair of metal traces by the interposer. The interposer further includes a matching network. A coating is formed on the disc to encapsulate the metal layer, interposer, and integrated circuit die.

15 Claims, 17 Drawing Sheets

U.S. PATENT DOCUMENTS

| | | | |
|---|---|---|---|
| 5,566,441 A | 10/1996 | Marsh et al. | |
| 5,585,193 A | 12/1996 | Josephy et al. | |
| 5,837,349 A | 11/1998 | Van Erden et al. | |
| 5,862,117 A * | 1/1999 | Fuentes et al. | 369/100 |
| 5,904,546 A | 5/1999 | Wood et al. | |
| 5,946,198 A | 8/1999 | Hoppe et al. | |
| 5,982,284 A | 11/1999 | Baldwin et al. | |
| 6,018,299 A | 1/2000 | Eberhardt | |
| 6,044,046 A * | 3/2000 | Diezmann et al. | 369/14 |
| 6,082,660 A | 7/2000 | Meyer | |
| 6,091,332 A | 7/2000 | Eberhardt et al. | |
| 6,145,901 A | 11/2000 | Rich | |
| 6,147,662 A | 11/2000 | Grabau et al. | |
| 6,165,386 A | 12/2000 | Endo et al. | |
| 6,206,292 B1 | 3/2001 | Robertz et al. | |
| 6,226,109 B1 * | 5/2001 | Tompkin et al. | 359/2 |
| 6,262,692 B1 | 7/2001 | Babb | |
| 6,265,977 B1 * | 7/2001 | Vega et al. | 340/572.7 |
| 6,281,795 B1 | 8/2001 | Smith et al. | |
| 6,322,903 B1 | 11/2001 | Siniaguine et al. | |
| 6,359,842 B1 * | 3/2002 | Taguchi et al. | 369/14 |
| 6,416,608 B1 | 7/2002 | Mynott et al. | |
| 6,451,154 B1 | 9/2002 | Grabau et al. | |
| 6,514,790 B1 | 2/2003 | Plettner et al. | |
| 6,606,247 B2 | 8/2003 | Credelle et al. | |
| 6,608,370 B1 | 8/2003 | Chen et al. | |
| 6,617,963 B1 * | 9/2003 | Watters et al. | 340/10.41 |
| 6,731,353 B1 | 5/2004 | Credelle et al. | |
| 7,086,073 B2 * | 8/2006 | Benedikt et al. | 720/719 |
| 2001/0014524 A1 * | 8/2001 | Farrar | 438/613 |
| 2003/0089970 A1 * | 5/2003 | Gates et al. | 257/678 |
| 2003/0136503 A1 | 7/2003 | Green et al. | |
| 2004/0052202 A1 * | 3/2004 | Brollier | 369/273 |

FOREIGN PATENT DOCUMENTS

| | | |
|---|---|---|
| DE | 198 05 031 C2 | 8/1999 |
| DE | 198 40 226 A1 | 3/2000 |
| FR | 2 775 533 | 9/1999 |
| WO | WO 00/14733 A1 | 3/2000 |
| WO | WO 01/54058 A1 | 7/2001 |
| WO | WO 01/61646 A1 | 8/2001 |
| WO | WO 01/95241 A1 | 12/2001 |
| WO | WO 02/37414 A1 | 5/2002 |
| WO | WO 02/49093 A1 | 6/2002 |
| WO | WO 02/082368 A1 | 10/2002 |

OTHER PUBLICATIONS

English Language Abstract for DE 19805031, published Aug. 19, 1999, 1 page.

English Language Abstract for DE 19840226, published Mar. 16, 2000, 1 page.

English Language Abstract for FR 2775533, published Sep. 3, 1999, 1 page.

Sarma, Sanjay, "White Paper-Towards the 5¢ Tag", Auto-ID Center, Published Nov. 1, 2001, pp. 1-19.

* cited by examiner

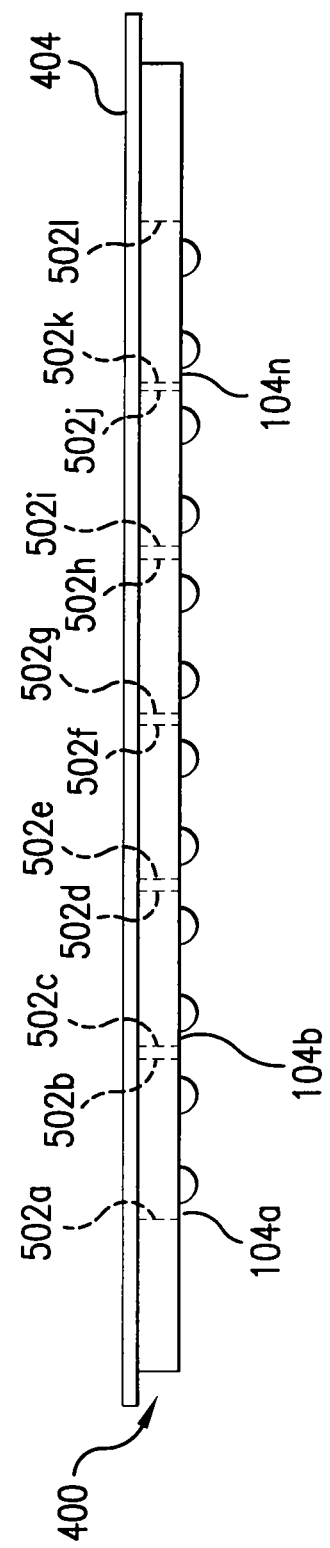

DURING FUTURE MANUFACTURING OF CD's A ANTENNA WILL BE APPLIED BETWEEN THE TWO DVD DISCS, BRINGING THE EFFECTIVE ANTENNA TO BOTH THE INSIDE LABEL AND THE OUTSIDE EDGE OF DISC

MATCHING CIRCUIT W/CHIP WILL BE EMBEDDED INTO A TAMPER LABEL DURING MANUFACTURING

METHOD, SYSTEM, AND APPARATUS FOR HIGH VOLUME ASSEMBLY OF COMPACT DISCS AND DIGITAL VIDEO DISCS INCORPORATING RADIO FREQUENCY IDENTIFICATION TAG TECHNOLOGY

CROSS-REFERENCE TO RELATED APPLICATIONS

This application claims the benefit of U.S. Provisional Application No. 60/477,735, filed Jun. 12, 2003, which is herein incorporated by reference in its entirety.

The following applications of common assignee are related to the present application, have the same filing date as the present application (Jun. 14, 2004), and are herein incorporated by reference in their entireties:

"Method And Apparatus For Expanding A Semiconductor Wafer," U.S. application Ser. No. 10/866,148;

"Method, System, And Apparatus For Authenticating Devices During Assembly," U.S. application Ser. No. 10/866,152;

"Method, System, And Apparatus For Transfer Of Dies Using A Die Plate Having Die Cavities," U.S. application Ser. No. 10/866,150;

"Method, System, And Apparatus For Transfer Of Dies Using A Die Plate," U.S. application Ser. No. 10/866,253;

"Method, System, And Apparatus For Transfer Of Dies Using A Pin Plate," U.S. application Ser. No. 10/866,159; and "Method, System, And Apparatus For High Volume Transfer Of Dies," U.S. application Ser. No. 10/866,149.

"Method and Apparatus for High Volume Assembly of Radio Frequency Identification Tags," U.S. Provisional application Ser. No. 60/400,101, filed Aug. 2, 2002;

"Method and Apparatus for High Volume Assembly of Radio Frequency Identification Tags," U.S. application Ser. No. 10/322,467, filed Dec. 19, 2002;

"Multi-Barrel Die Transfer Apparatus and Method for Transferring Dies Therewith," U.S. application Ser. No. 10/322,7 18, filed Dec. 19, 2002;

"Die Frame Apparatus and Method of Transferring Dies Therewith," U.S. application Ser. No. 10/322,701, filed Dec. 19, 2002;

"System and Method of Transferring Dies Using an Adhesive Surface,"U.S. application Ser. No. 10/322,702, filed Dec. 19, 2002; and "Method and System for Forming a Die Frame and for Transferring Dies Therewith," U.S. application Ser. No. 10/429,803, filed May 6, 2003.

"Method and System for Forming a Die Frame and for Transferring Dies Therewith," Ser. No. 10/429,803, filed May 6, 2003.

BACKGROUND OF THE INVENTION

1. Field of the Invention

The present invention relates generally to the assembly of electronic devices. More particularly, the present invention relates to the transfer of dies from wafers to substrates, including substrates of radio frequency identification (RFID) tags.

2. Related Art

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one die at a time. This has a drawback of limiting throughput volume. Furthermore, pick and place techniques have limited placement accuracy, and have a minimum die size requirement.

One type of electronic device that may be assembled using pick and place techniques is an RFID "tag." An RFID tag may be affixed to an item whose presence is to be detected and/or monitored. The presence of an RFID tag, and therefore the presence of the item to which the tag is affixed, may be checked and monitored by devices known as "readers."

As market demand increases for products such as RFID tags, and as die sizes shrink, high assembly throughput rates for very small die, and low production costs are crucial in providing commercially-viable products. Accordingly, what is needed is a method and apparatus for high volume assembly of electronic devices, such as RFID tags, that overcomes these limitations.

SUMMARY OF THE INVENTION

The present invention is directed to methods, systems, and apparatuses for producing one or more electronic devices, such as RFID tags, that each include a die having one or more electrically conductive contact pads that provide electrical connections to related electronics on a substrate.

According to the present invention, electronic devices are formed at much greater rates than conventionally possible. In one aspect, large quantities of dies can be transferred directly from a wafer to corresponding substrates of a web of substrates. In another aspect, large quantities of dies can be transferred from a support surface to corresponding substrates of a web of substrates. In another aspect, large quantities of dies can be transferred from a wafer or support surface to an intermediate surface, such as a die plate. The die plate may have cells formed in a surface thereof in which the dies reside. Otherwise, the dies can reside on a surface of the die plate. The dies of the die plate can then be transferred to corresponding substrates of a web of substrates.

In an aspect, a punch plate, punch roller or cylinder, or expandable material can be used to transfer dies from the die plate to substrates.

Large quantities of dies can be transferred. For example, 10s, 100s, 1000s, or more dies, or even all dies of a wafer, support surface, or die plate, can be simultaneously transferred to corresponding substrates of a web.

In one aspect, dies may be transferred between surfaces in a "pads up" orientation. When dies are transferred to a substrate in a "pads up" orientation, related electronics can be printed or otherwise formed to couple contact pads of the die to related electronics of the tag substrate.

In an alternative aspect, the dies may be transferred between surfaces in a "pads down" orientation. When dies are transferred to a substrate in a "pads down" orientation, related electronics can be pre-printed or otherwise pre-deposited on the tag substrates.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 5 is a view of a wafer having separated dies affixed to a support surface.

Figure 1A:
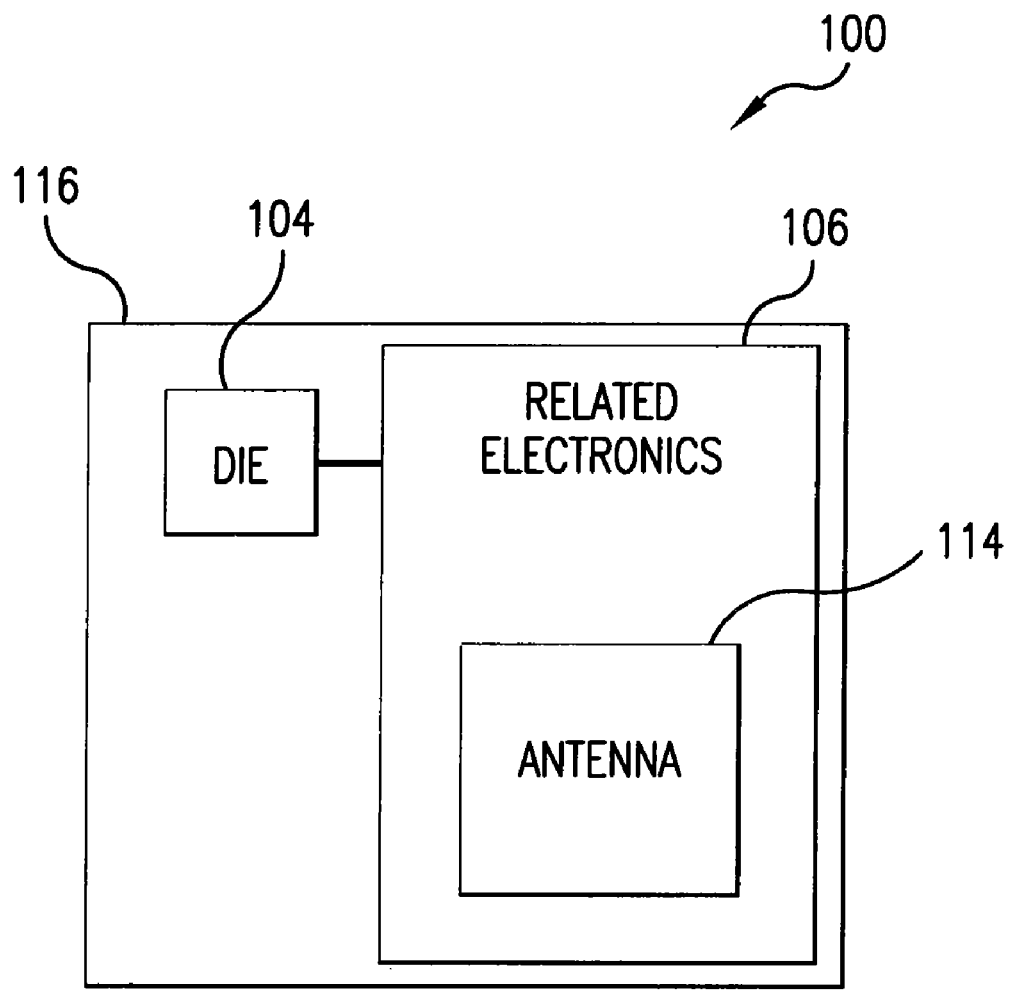
FIG. 1A shows a block diagram of an exemplary RFID tag, according to an embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The present invention provides improved processes and systems for assembling electronic devices, including RFID tags. The present invention provides improvements over current processes. Conventional techniques include vision-based systems that pick and place dies one at a time onto substrates. The present invention can transfer multiple dies simultaneously. Vision-based systems are limited as far as the size of dies that may be handled, such as being limited to dies larger than 600 microns square. The present invention is applicable to dies 100 microns square and even smaller. Furthermore, yield is poor in conventional systems, where two or more dies may be accidentally picked up at a time, causing losses of additional dies. The present invention allows for improved yield values.

The present invention provides an advantage of simplicity. Conventional die transfer tape mechanisms may be used by the present invention. Furthermore, much higher fabrication rates are possible. Current techniques process 5-8 thousand units per hour. The present invention can provide improvements in these rates by a factor of N. For example, embodiments of the present invention can process dies 5 times as fast as conventional techniques, at 100 times as fast as conventional techniques, and at even faster rates. Furthermore, because the present invention allows for flip-chip die attachment techniques, wire bonds are not necessary.

Elements of the embodiments described herein may be combined in any manner. Example RFID tags are described in the section below. Assembly embodiments for RFID tags are described in the next section. Example applications for tags and tag assembly techniques are then described, followed by a description of example substrate webs and antenna layouts.

1.0 RFID Tag

The present invention is directed to techniques for producing electronic devices, such as RFID tags. For illustrative purposes, the description herein primarily relates to the production of RFID tags. However, the description is also adaptable to the production of further electronic device types, as would be understood by persons skilled in the relevant art(s) from the teachings herein.

Figure 1B:
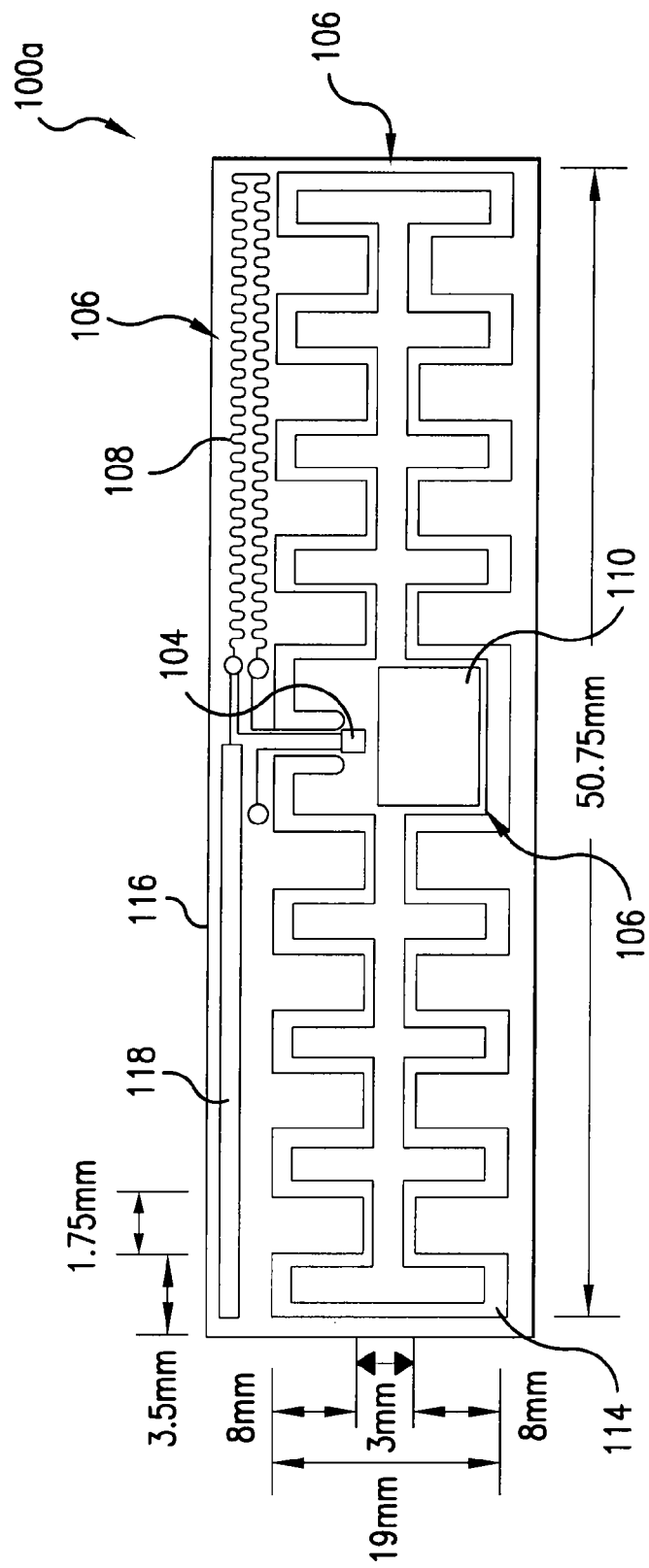
FIGS. 1B and 1C show detailed views of exemplary RFID tags, according to embodiments of the present invention.
Figure 1C:
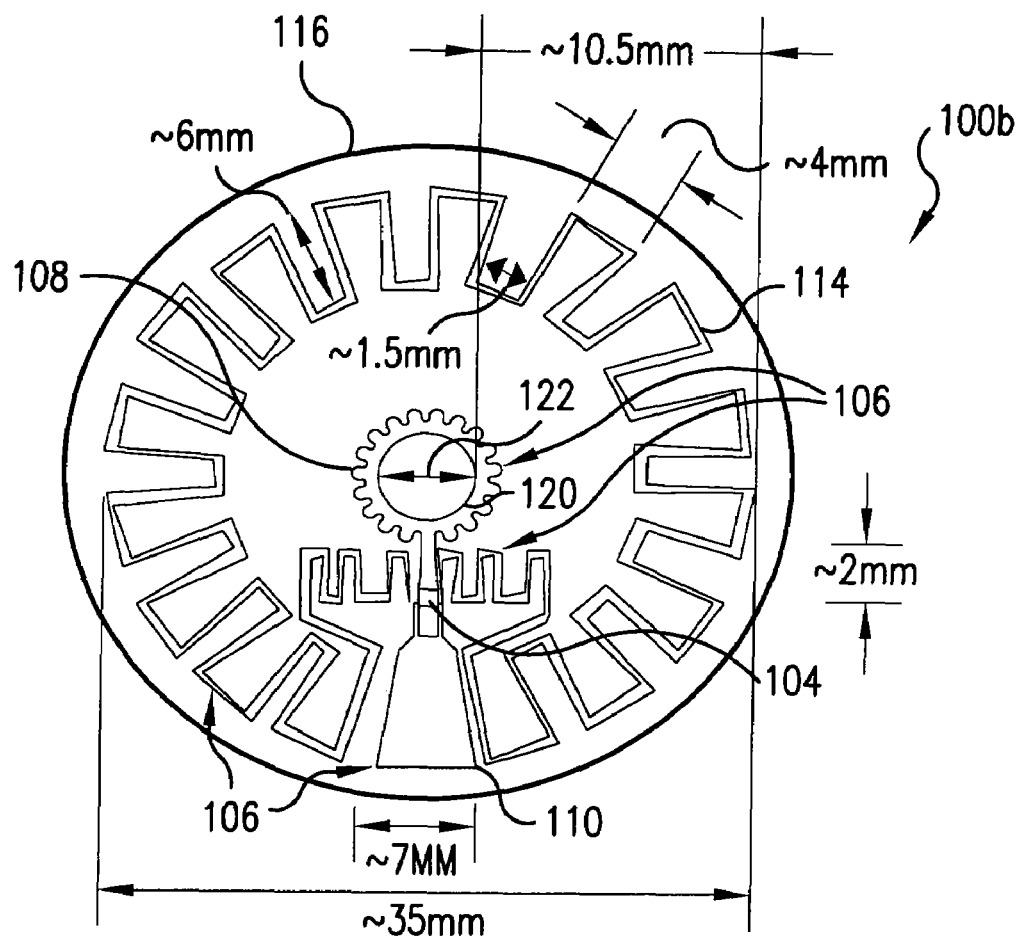

FIG. 1A shows a block diagram of an exemplary RFID tag 100, according to an embodiment of the present invention. As shown in FIG. 1A, RFID tag 100 includes a die 104 and related electronics 106 located on a tag substrate 116. Related electronics 106 includes an antenna 114 in the present example. FIGS. 1B and 1C show detailed views of exemplary RFID tags 100, indicated as RFID tags 100a and 100b. As shown in FIGS. 1B and 1C, die 104 can be mounted onto antenna 114 of related electronics 106. As is further described elsewhere herein, die 104 may be mounted in either a pads up or pads down orientation.

RFID tag 100 may be located in an area having a large number, population, or pool of RFID tags present. RFID tag 100 receives interrogation signals transmitted by one or more tag readers. According to interrogation protocols, RFID tag 100 responds to these signals. Each response includes information that identifies the corresponding RFID tag 100 of the potential pool of RFID tags present. Upon reception of a response, the tag reader determines the identity of the responding tag, thereby ascertaining the existence of the tag within a coverage area defined by the tag reader.

RFID tag 100 may be used in various applications, such as inventory control, airport baggage monitoring, as well as security and surveillance applications. Thus, RFID tag 100 can be affixed to items such as airline baggage, retail inventory, warehouse inventory, automobiles, compact discs (CDs), digital video discs (DVDs), video tapes, and other objects. RFID tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al. entitled System and Method for Electronic Inventory, and U.S. patent application Ser. No. 10/072,885, filed on Feb. 12, 2002, both of which are incorporated by reference herein in its entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C. Other materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIGS. 1A-1C, tag substrate 116 has a first surface that accommodates die 104, related electronics 106, as well as further components of tag 100. Tag substrate 116 also has a second surface that is opposite the first surface. An adhesive material or backing can be included on the second surface. When present, the adhesive backing enables tag 100 to be attached to objects, such as books and consumer products. Tag substrate 116 is made from a material, such as polyester, paper, plastic, fabrics such as cloth, and/or other materials such as commercially available Tyvec®.

In some implementations of tags 100, tag substrate 116 can include an indentation, "cavity," or "cell" (not shown in FIGS. 1A-1C) that accommodates die 104. An example of such an implementation is included in a "pads up" orientation of die 104.

Figure 2B:
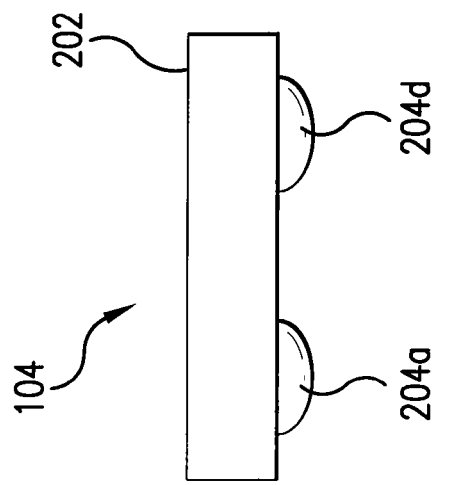
FIGS. 2A and 2B show plan and side views of an exemplary die, respectively.
Figure 2A:
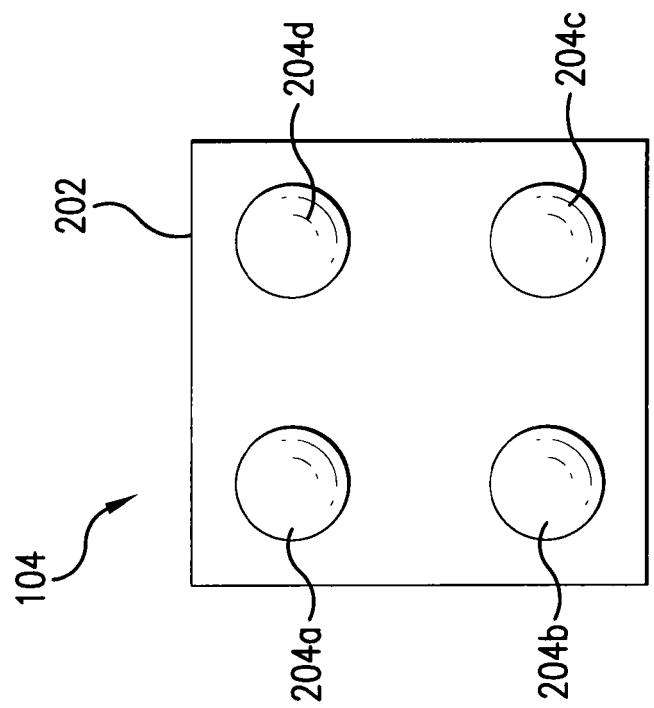

FIGS. 2A and 2B show plan and side views of an example die 104. Die 104 includes four contact pads 204*a-d* that provide electrical connections between related electronics 106 and internal circuitry of die 104. Note that although four contact pads 204*a-d* are shown, any number of contact pads may be used, depending on a particular application. Contact pads 204 are made of an electrically conductive material during fabrication of the die. Contact pads 204 can be further built up if required by the assembly process, by the deposition of additional and/or other materials, such as gold and solder flux. Such post processing, or "bumping," will be known to persons skilled in the relevant art(s).

Figure 2C:
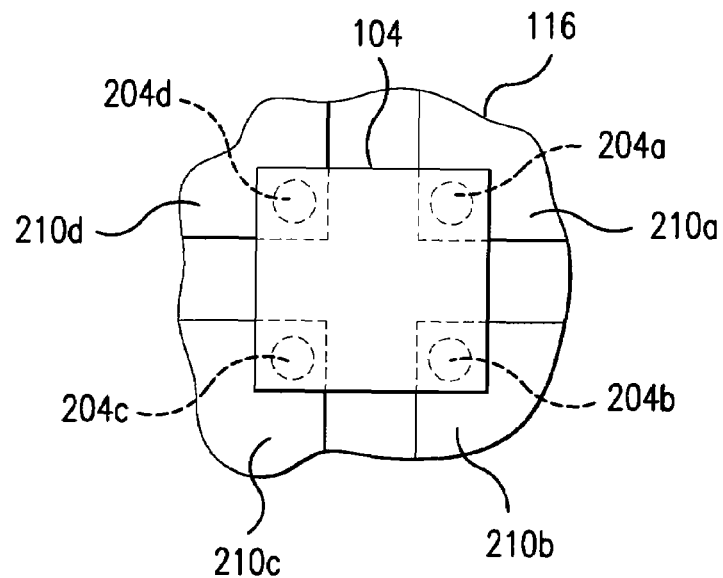
FIGS. 2C and 2D show portions of a substrate with a die attached thereto, according to example embodiments of the present invention.
Figure 2D:
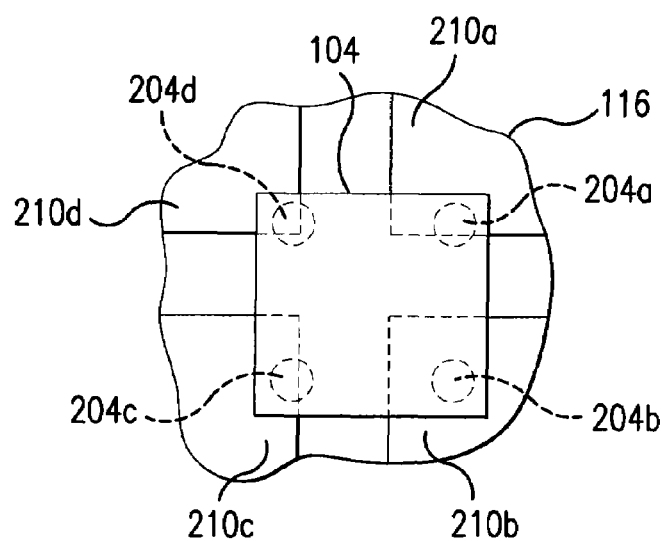

FIG. 2C shows a portion of a substrate 116 with die 104 attached thereto, according to an example embodiment of the present invention. As shown in FIG. 2C, contact pads 204*a-d* of die 104 are coupled to respective contact areas 210*a-d* of substrate 116. Contact areas 210*a-d* provide electrical connections to related electronics 106. The arrangement of contact pads 204*a-d* in a rectangular (e.g., square) shape allows for flexibility in attachment of die 104 to substrate 116, and good mechanical adherement. This arrangement allows for a range of tolerance for imperfect placement of IC die 104 on substrate 116, while still achieving acceptable electrical coupling between contact pads 204*a-d* and contact areas 210*a-d*. For example, FIG. 2D shows an imperfect placement of 1C die 104 on substrate 116. However, even though IC die 104 has been improperly placed, acceptable electrical coupling is achieved between contact pads 204*a-d* and contact areas 210*a-d*.

Note that although FIGS. 2A-2D show the layout of four contact pads 204*a-d* collectively forming a rectangular shape, greater or lesser numbers of contact pads 204 may be used. Furthermore, contact pads 204*a-d* may be laid out in other shapes in embodiments of the present invention.

2.0 RFID Tag Assembly

The present invention is directed to continuous-roll assembly techniques and other techniques for assembling tags, such as RFID tag 100. Such techniques involve a continuous web (or roll) of the material of the tag antenna substrate 116 that is capable of being separated into a plurality of tags. Alternatively, separate sheets of the material can be used as discrete substrate webs that can be separated into a plurality of tags. As described herein, the manufactured one or more tags can then be post processed for individual use. For illustrative purposes, the techniques described herein are made with reference to assembly of RFID tag 100. However, these techniques can be applied to other tag implementations and other suitable devices, as would be apparent to persons skilled in the relevant art(s) from the teachings herein.

The present invention advantageously eliminates the restriction of assembling electronic devices, such as RFID tags, one at a time, allowing multiple electronic devices to be assembled in parallel. The present invention provides a continuous-roll technique that is scalable and provides much higher throughput assembly rates than conventional pick and place techniques.

Figure 3:
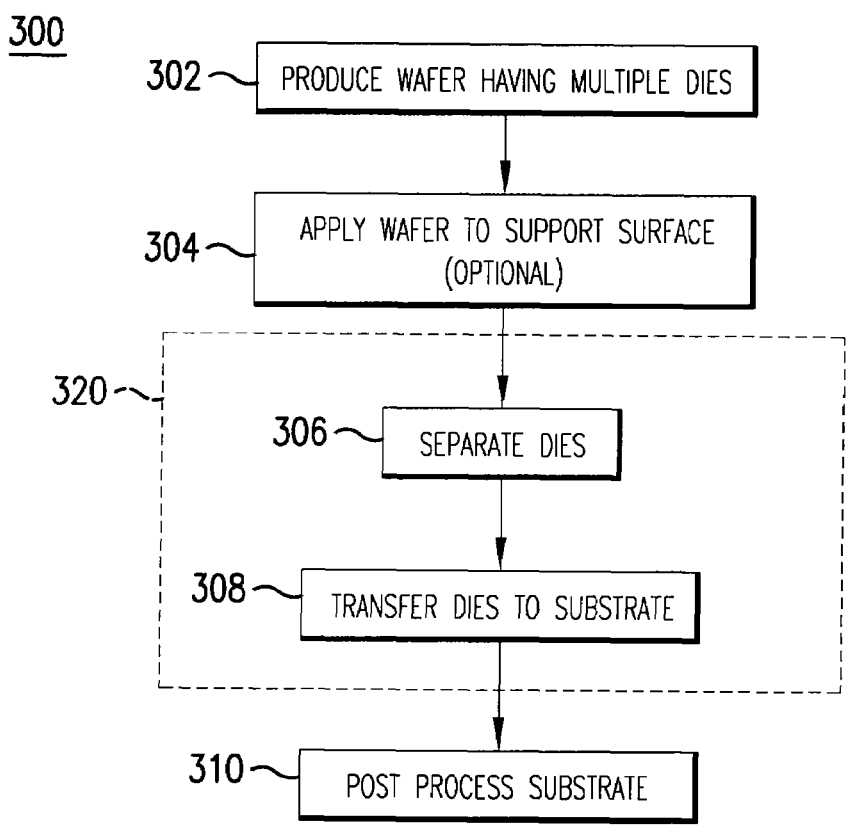
FIG. 3 is a flowchart illustrating a tag assembly process, according to embodiments of the present invention.
Figure 4A:
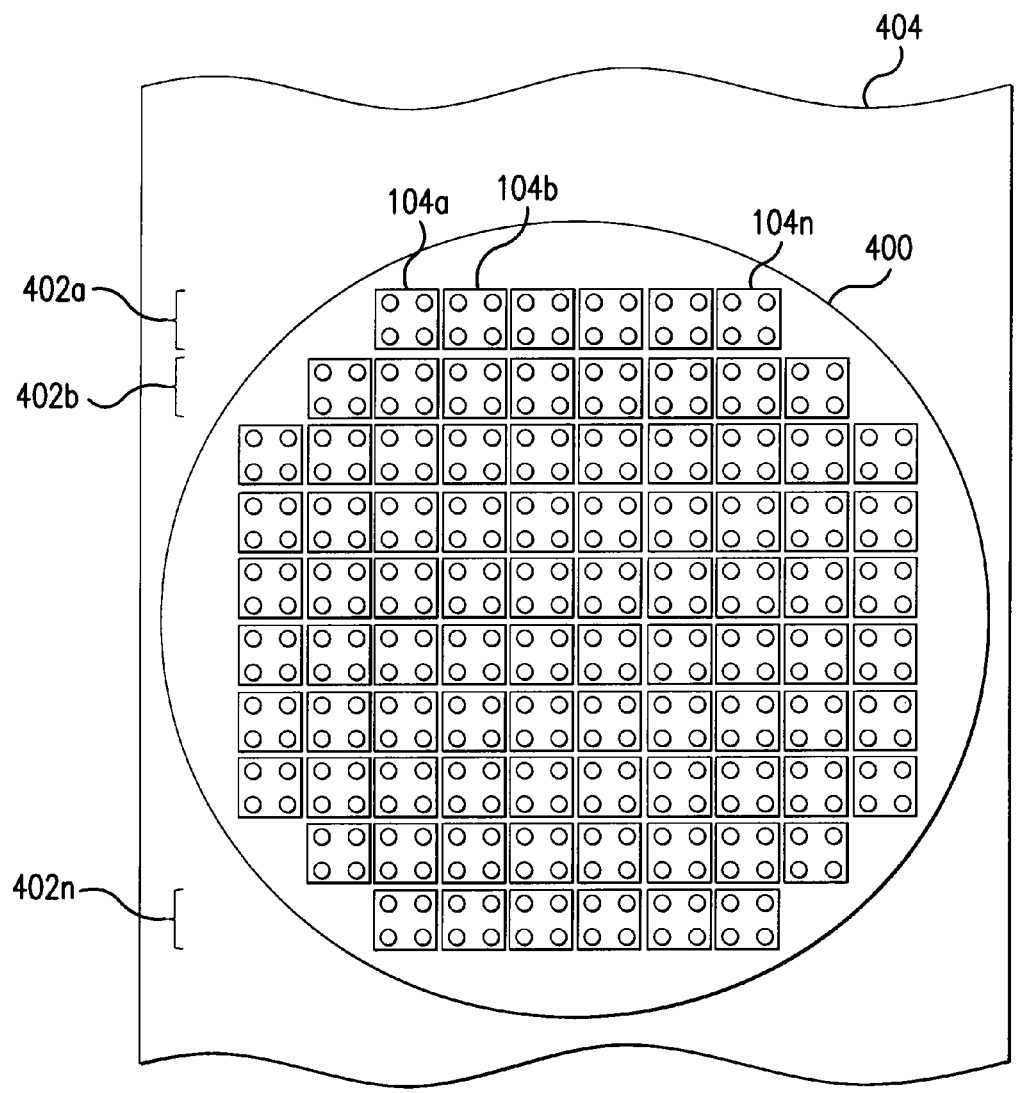
FIGS. 4A and 4B are plan and side views of a wafer having multiple dies affixed to a support surface, respectively.

FIG. 3 shows a flowchart 300 with example steps relating to continuous-roll production of RFID tags 100, according to example embodiments of the present invention. FIG. 3 shows a flowchart illustrating a process 300 for assembling tags 100. Process 300 begins with a step 302. In step 302, a wafer 400 having a plurality of dies 104 is produced. FIG. 4A illustrates a plan view of an exemplary wafer 400. As illustrated in FIG. 4A, a plurality of dies 104 are arranged in a plurality of rows 402*a-n*.

Figure 4B:
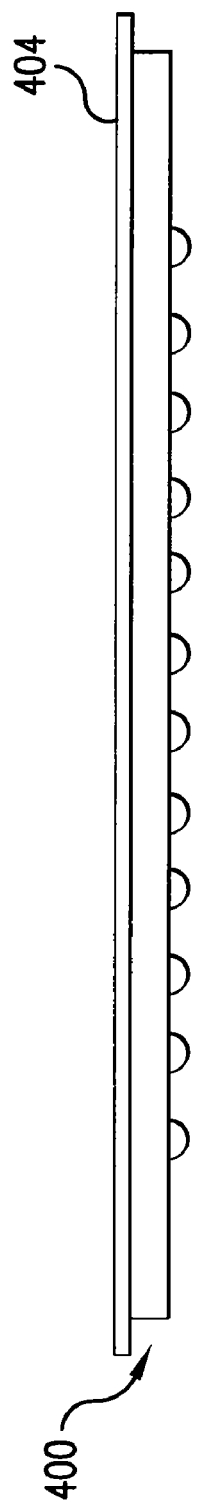

In a step 304, wafer 400 is optionally applied to a support structure or surface 404. Support surface 404 includes an adhesive material to provide adhesiveness. For example support surface 404 may be an adhesive tape that holds wafer 400 in place for subsequent processing. FIG. 4B shows an example view of wafer 400 in contact with an example support surface 404. In some embodiments, wafer 400 does not need to be attached to a support surface, and can be operated on directly.

In a step 306, the plurality of dies 104 on wafer 400 are separated. For example, step 306 may include scribing wafer 400 according to a process, such as laser etching. FIG. 5 shows a view of wafer 400 having example separated dies 104 that are in contact with support surface 404. FIG. 5 shows a plurality of scribe lines 502*a-l* that indicate locations where dies 104 are separated.

In a step 308, the plurality of dies 104 is transferred to a substrate. For example, dies 104 can be transferred from support surface 404 to tag substrates 116. Alternatively, dies 104 can be directly transferred from wafer 400 to substrates 116. In an embodiment, step 308 may allow for "pads down" transfer. Alternatively, step 308 may allow for "pads up" transfer. As used herein the terms "pads up" and "pads down" denote alternative implementations of tags 100. In particular, these terms designate the orientation of connection pads 204 in relation to tag substrate 116. In a "pads up" orientation for tag 100, die 104 is transferred to tag substrate 116 with pads 204*a*-204*d* facing away from tag substrate 116. In a "pads down" orientation for tag 100, die 104 is transferred to tag substrate 116 with pads 204*a*-204*d* facing towards, and in contact with tag substrate 116.

Note that step 308 may include multiple die transfer iterations. For example, in step 308, dies 104 may be directly transferred from a wafer 400 to substrates 116. Alternatively, dies 104 may be transferred to an intermediate structure, and subsequently transferred to substrates 116. Example embodiments of such die transfer options are described below.

Note that steps 306 and 308 can be performed simultaneously in some embodiments. This is indicated in FIG. 3 by step 320, which includes both of steps 306 and 308. Example embodiments where dies 104 of a wafer 400 are separated, and simultaneously transferred to a subsequent surface, are described below.

In a step 310, post processing is performed. During step 310, assembly of RFID tag(s) 100 is completed.

3.0 Example Tag Applications

All types of objects may have RFID tags applied thereto for all types of purposes, including of tracking, inventory, security checks, etc. According to embodiments of the present invention, the tags may be applied to the objects after the objects are manufactured. In further embodiments of the present invention, the tags may be incorporated in the objects during manufacture of the objects. Tags may be incorporated into any number of types of objects. Example objects in which a tag may be incorporated during manufacturing, and example manufacturing processes therefor, are described below.

In an embodiment of the present invention, a compact disc/optical disc medium that is tagged, and its manufacture, is described. In other words, manufacturing techniques for optical discs or compact discs that incorporate RFID tag technology are described. In this manner, the optical disc or compact disc medium of the present invention is trackable. The present invention is applicable to any type of optical disc or compact disc, including compact disc read only memories (CDROM), CD-RW (CD re-writable), digital video discs (DVD), DVD-R, DVD-RW, and other types of compact discs or optical discs.

Figure 6:
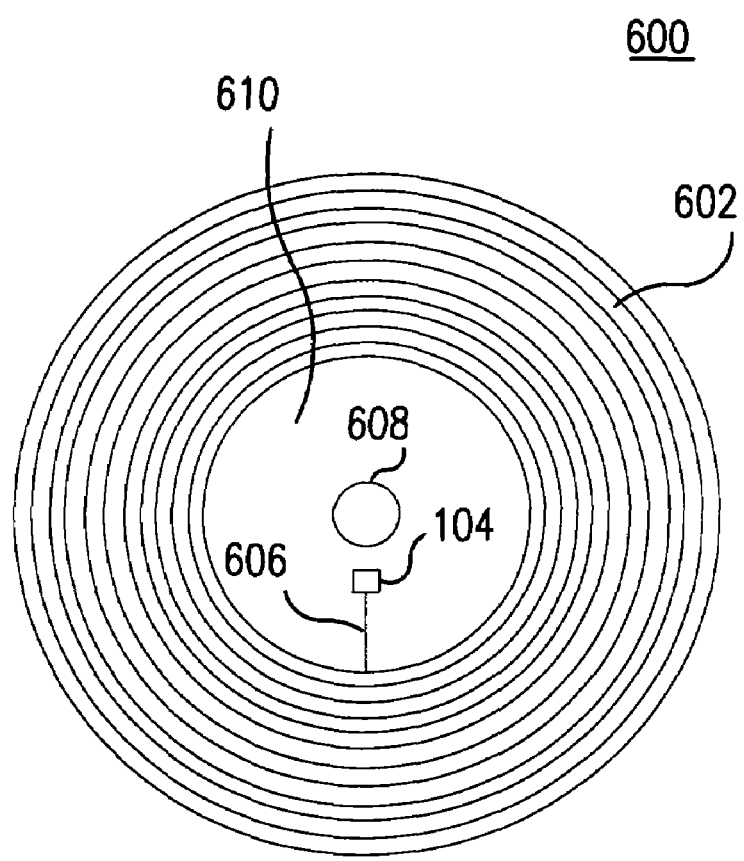
FIG. 6 shows an example tagged optical disc, according to an embodiment of the present invention.

For example, FIG. 6 shows an example tagged or trackable optical disc 600, according to an embodiment of the present invention. Optical disc 600 includes a disc substrate 610, a metal layer 602, a die 104, and an electrical connection 606. Metal layer 602 is formed on disc substrate 610. Metal layer 602 is digitally encoded with the information stored by optical disc 600. Disc substrate 610 is typically a plastic disc, but can be made from other materials. A die 104 is mounted on disc substrate 610. Furthermore, optical disc 600 has a centrally located opening 608. According to embodiments of the present invention, die 104 is coupled to metal layer 602 by electrical connection 606. Metal layer 602 operates as an antenna for optical disc 600. Die 104 includes logic/processing capability for receiving signals from RFTD readers, and transmitting responses to the same, through the antenna of metal layer 602. Thus, optical disc 600 operates as a RFIID tagged object. In embodiments, electrical connection 606 includes an impedance matching network to match die 104 with the antenna of metal layer 602.

Figure 7:
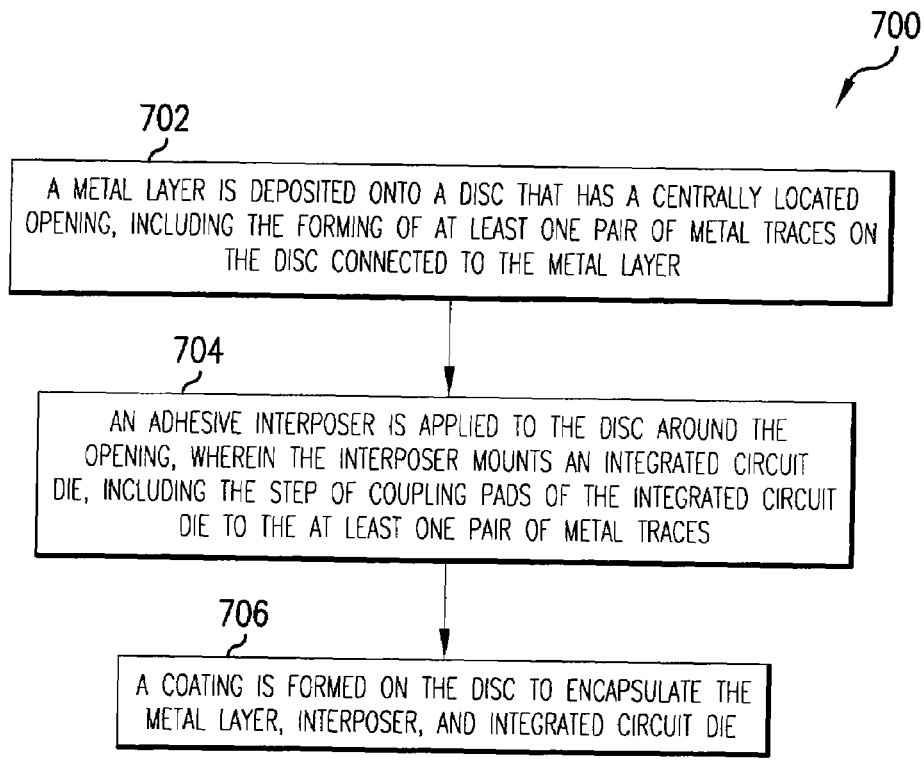
FIG. 7 shows a flowchart providing example steps for manufacturing a tagged optical disc, according to embodiments of the present invention.

FIG. 7 shows example steps related to a flowchart 700 for manufacturing a tagged optical disc, such as optical disc 600, according to embodiments of the present invention. Further operational and structural embodiments of the present invention will be apparent to persons skilled in the relevant art based on the following discussion. Furthermore, FIGS. 8 to 11 relate to the steps of flowchart 700.

Figure 8:
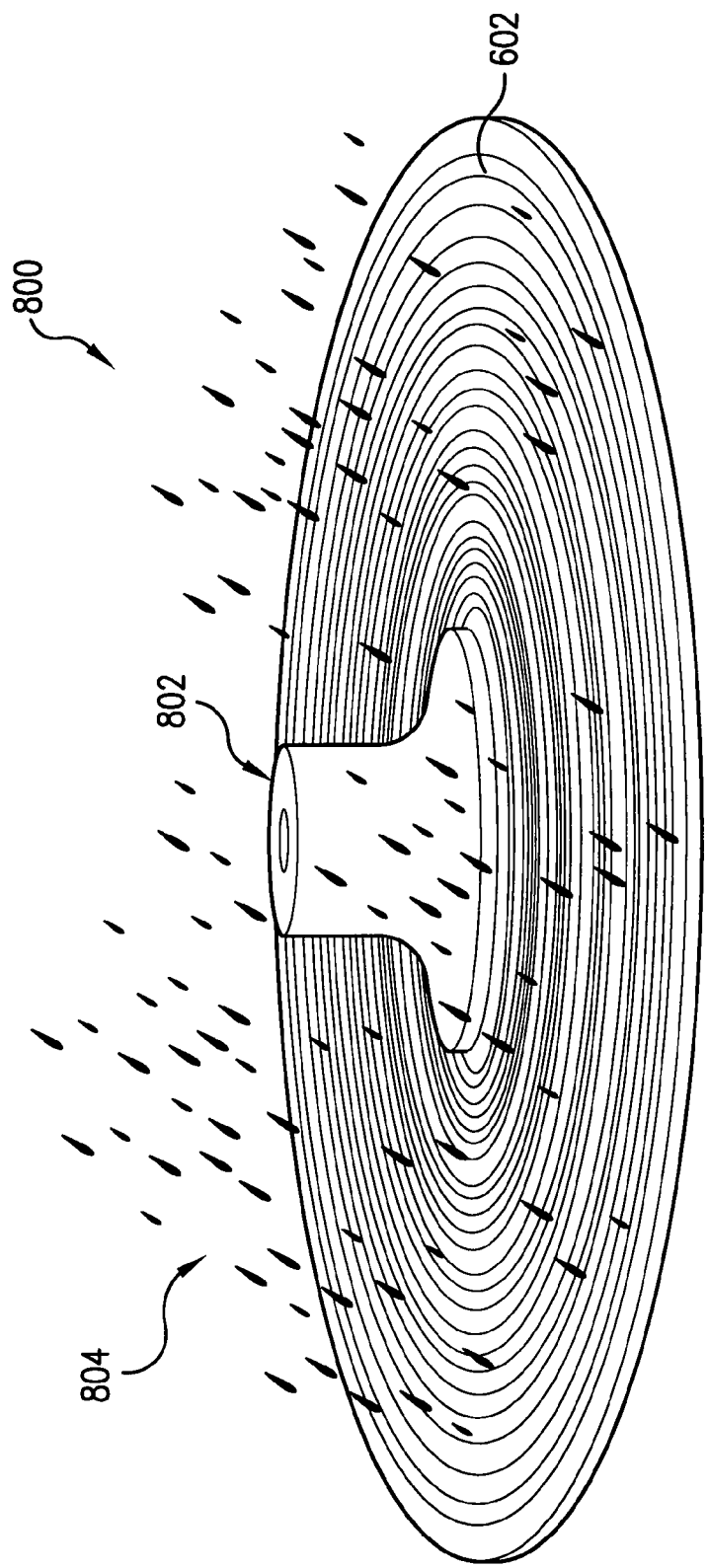
FIG. 8 shows metal being deposited onto a disc substrate having an example disc hub thereon to form metal connections, according to an embodiment of the present invention.

FIG. 8 shows an example of step 702 of flowchart of 700. For example as shown in FIG. 8, a metal layer, such as metal layer 602, is deposited on the disc substrate 610 of optical disc 600. For example, metal layer 602 can be deposited on optical disc 800 using a disc vapor metalization process, where a metal vapor 804 is applied to optical disc 800.

Furthermore, in step 702, at least one pair of metal traces on the disc are formed that are connected to metal layer 602. In an embodiment, the metal traces of the one or more pairs are positioned on opposite sides of the central opening 608. For example, as shown in FIG. 8, these metal traces are formed using a modified disc hub 802. Disc hub 802 is shown centrally located on optical disc 600 in FIG. 8. Disc hub 802 can be a conventional disc hub, with feed lines formed therein, to allow the metal deposition process to form traces on the disc substrate 610. Thus, through the use of disc hub 802, conventional processes can be used to metallize an optical disc, while disc hub 802 allows the addition of metal traces for connectivity to an integrated circuit die, as described below. Little or no interruption of normal disc metallization is caused by disc hub 802.

Figure 9A:
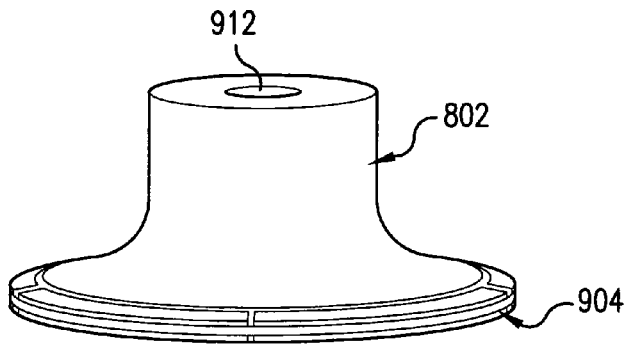
FIGS. 9A-9C show views of an example disc hub, according to embodiment of the present invention.
Figure 9B:
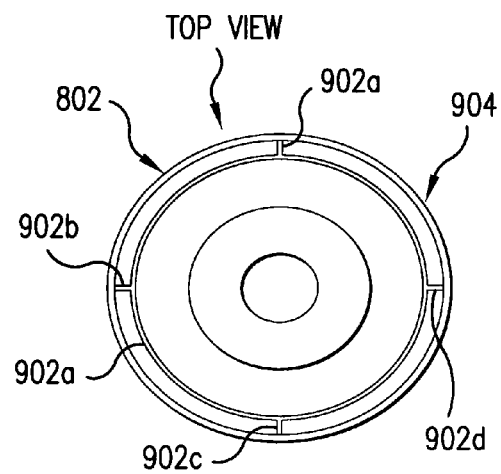
Figure 9C:
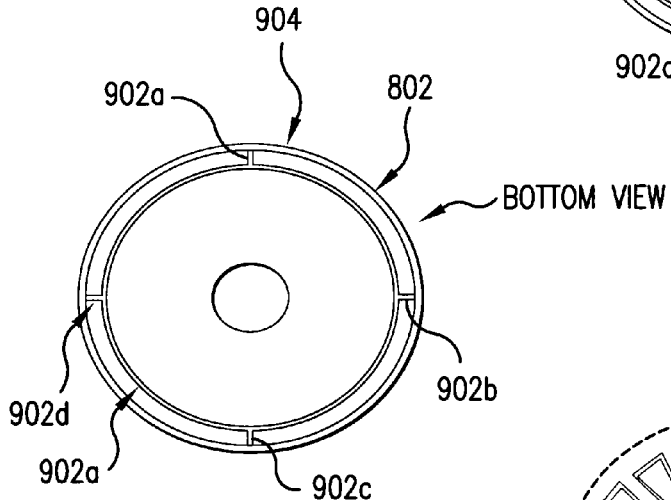

FIGS. 9A-9C and 10A-10C show further details of example embodiments of modified disc hub 802. As shown in FIG. 8, disc hub 802 is present on optical disc 600 when metal vapor 804 is applied to optical disc 600. As shown in FIGS. 9A-9C, disc hub 802 has modifications made thereto, in the form of feed lines 902. FIGS. 9A-9C shows side, top and bottom views of disc hub 802, respectively. As shown in FIGS. 9B and 9C, a first circumferential feed line 902a is continuous around an outer area of disc hub 802, near an outer edge of disc hub 802. Four feed line segments 902b-e are spaced around disc hub 802, and are coupled to the first circumferential feed line 902a. The four feed line segments 902b-e extend radially outward to the edges of disc hub 802. Thus, when a metal vapor is applied to optical disc 600 that mounts disc hub 802, traces are formed in feed lines 902a-e on the top surface of optical disc 600. Feed lines 902 allows metal to migrate to the portions of the optical disc that are thereby exposed to create metal traces on the optical disc. These metal traces are used to couple die 104 to metal layer 602, as further described below. For example, the metal traces allows a direct contact between metal layer 602 and a matching network (coupled to die 104) on an interposer applied to the optical disc.

Note that in an embodiment, a collar ring 904 may be present, when needed to hold together outer segments of disc hub 802 that may be otherwise loosely coupled to disc hub 802 due to feed lines 902b-e, as shown in FIGS. 9B and 9C. As shown in FIGS. 9A-9C, collar ring 904 wraps around an outer circumference of disc hub 802.

Furthermore, disc hub 802 includes a central bore 912. Central bore 912 may be present to be used to hold/handle disc hub 802, and to align disc hub 802 with a disc substrate 610 (e.g., align disc hub 802 with a central hole through disc substrate 610).

Figure 9D:
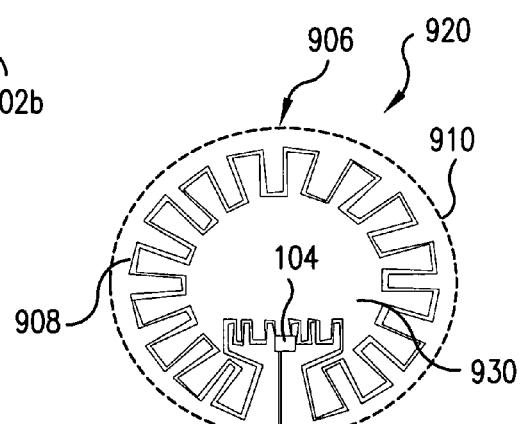
FIG. 9D shows an example interposer, according to an embodiment of the present invention.

FIG. 9D shows an interposer 920, according to an embodiment of the present invention. Interposer 920 includes an interposer substrate 930, matching network 908, a die 104, and a conductive ring 910 that is electrically coupled to die 104 and matching network 908. Furthermore, interposer 920 has a conductive adhesive 906 formed at least around an outer edge of interposer 920. Thus, as shown in step 704 of FIG. 7, interposer 920 can be applied to a disc substrate 610 after metal layer 602 has been formed thereon, to complete assembly of optical disc 600. For example, interposer 920 may be applied to disc substrate 610 in a sticker-like fashion, or in any other manner. Interposer 920 may include further adhesive material (e.g., non-conductive) to enhance adhesion of interposer 920 to disc substrate 610.

When interposer 920 is attached to disc substrate 610, conductive ring 910 of sticker 920 becomes electrically coupled to the metal traces formed on optical disc 600 using disc hub 802. Conductive adhesive 906 enhances this electrical coupling. Thus, die 104 and matching network 908 become electrically coupled to metal layer 602 because conductive ring 910 becomes electrically coupled to the metal traces formed on disc substrate 610 by feed lines 902 of disc hub 802, described above. Thus, optical disc 600 can operate as an RFID tagged object, and can respond to interrogations by a reader.

Figure 10A:
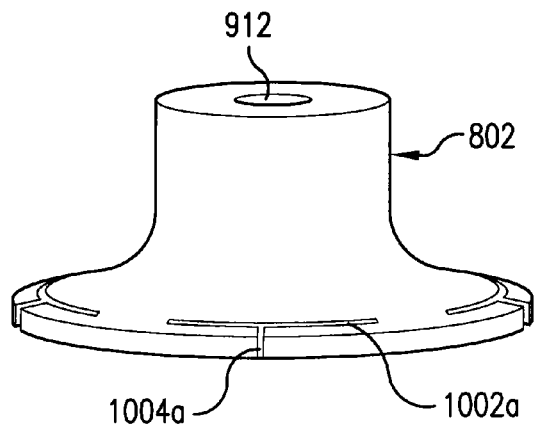
FIGS. 10A-10C show views of an example disc hub, according to embodiment of the present invention.
Figure 10B:
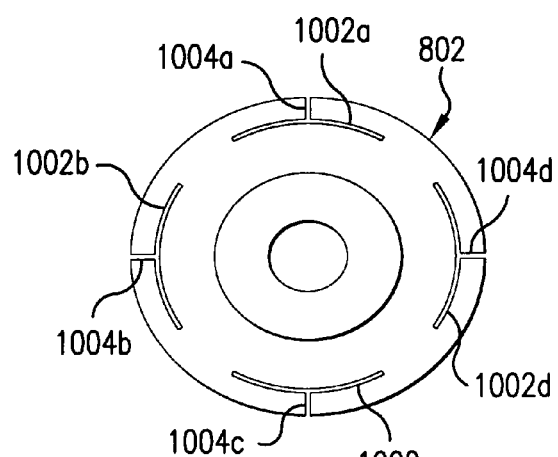
Figure 10C:
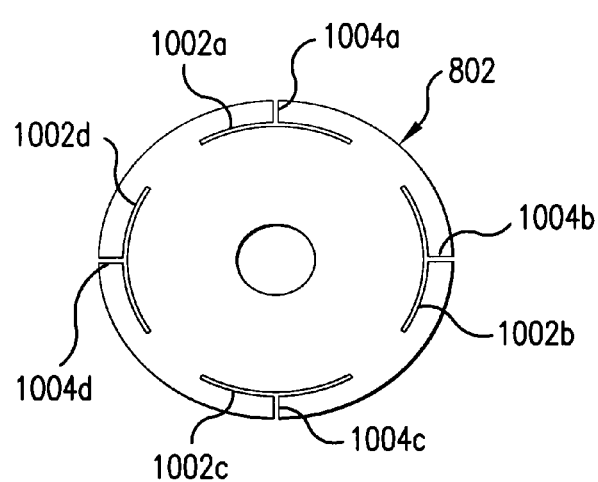

FIGS. 10A-10C show views of an alternate embodiment for disc hub 802. As shown in the embodiment of FIGS. 10A-10C, four separate circular feed lines 1002*a-d* are present in series around the diameter of disc hub 802. Feed lines 1002*a-d* do not form a continuous circle around an outer edge of disc hub 802, as does feed line 902*a* shown in FIGS. 9A-9C. Instead feed lines 1002*a-d* are discrete, partially circumferential, and are spaced around disc hub 802. Each feed line 1002*a-d* has a corresponding radial feed line segment 1004*a-d* that connects the respective feed line 1002*a-d* to an outer edge of disc hub 802. Thus, when metal vapor 802 is applied to disc hub 802 of FIG. 10, metal traces are formed on disc substrate 610 that are not continuous around optical disc 600. Furthermore, the metal traces formed on disc substrate 610 are formed to be coupled to metal layer 602. Thereafter, an interposer, such as interposer 920, can be applied as described above, with outer conductive ring 910 becoming electrically coupled with the metal traces formed by feed lines 1002*a-d* and 1004*a-d*, and therefore becoming coupled to metal layer 602.

As shown for step 706 in FIG. 7, after interposer 920 is applied to an optical disc 600 (e.g., after step 704), a protective coating can be formed on disc 600 to encapsulate metal layer 602, interposer 920, and die 104, if desired.

Note that additional embodiments for disc hub 802 will be apparent to persons skilled in the relevant art(s) from the teachings herein.

Figure 11:
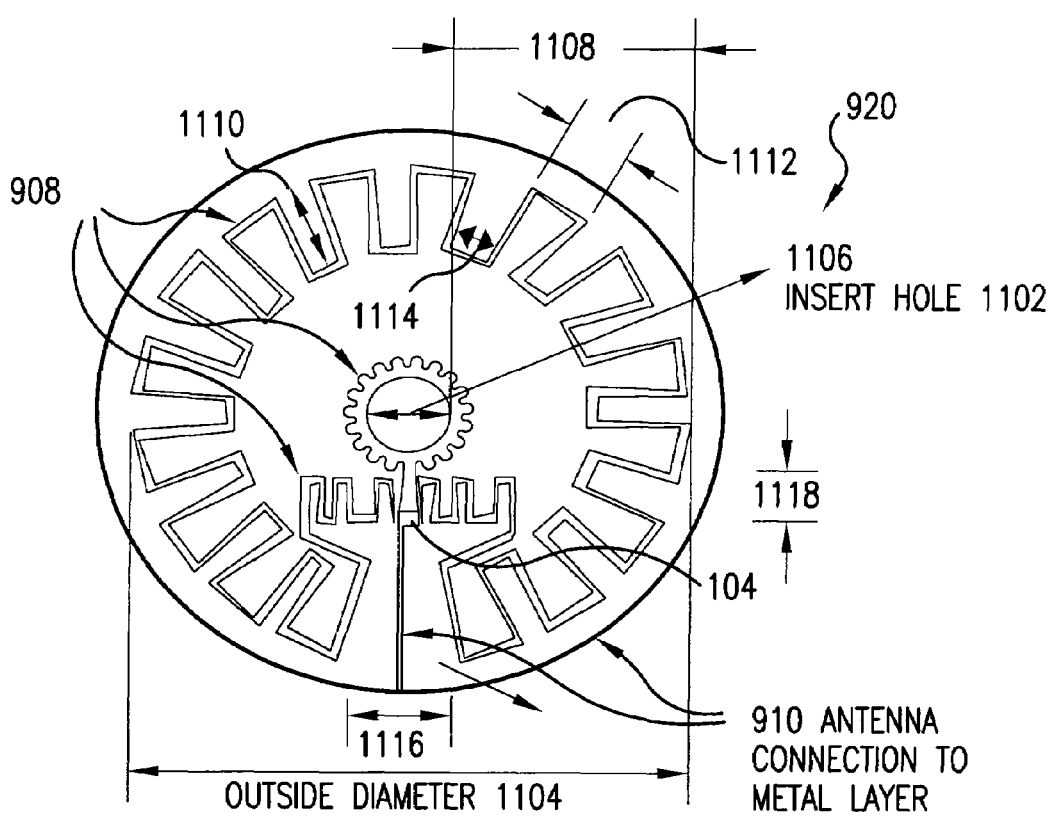
FIG. 11 shows an example interposer, according to an embodiment of the present invention.

FIG. 11 shows further details of an example embodiment for interposer 920. For example, interposer 920 includes a matching network patterned on the interposer substrate that is applicable to a 916 MHz DVD. FIG. 11 is provided for illustrative purposes, and is not limiting. It will be apparent to persons skilled in the relevant art(s) that interposer 920 can be varied to create matching networks applicable to all varieties of disc medium and signal frequencies. These variations are within the scope and spirit of the present invention.

In the example embodiment of FIG. 11, an outside diameter 1104 for matching network 908 is approximately 35 mm. A diameter 1106 of the central insert hole 1102 of interposer 920 is approximately 14 mm. A distance 1108 from an edge of the central insert hole 1102 to an edge of matching network 908 is approximately 21 mm. Matching network 908 includes a circular outer portion, a circular inner portion, and a portion in line with the mounting position of die 104. The outer portion of matching network 908 forms a circle substantially around interposer 920. The inner portion of matching network forms a circle substantially around the central insert hole 1102 of interposer 920. A width 1110 of an outer portion of matching network 908 is approximately 6 mm. The outer portion of matching network includes a plurality of repeating squared "zig-zag" portions. An outer width 1112 of one zig-zag portion is approximately 4 mm. An inner width 1114 of one zig-zag portion is approximately 1.5 mm. A width 1116 between ends of the outer portion of the matching network 908 is approximately 7 mm. A width 1118 of the portion in line with the mounting position of die 104 is approximately 2 mm.

Figure 12A:
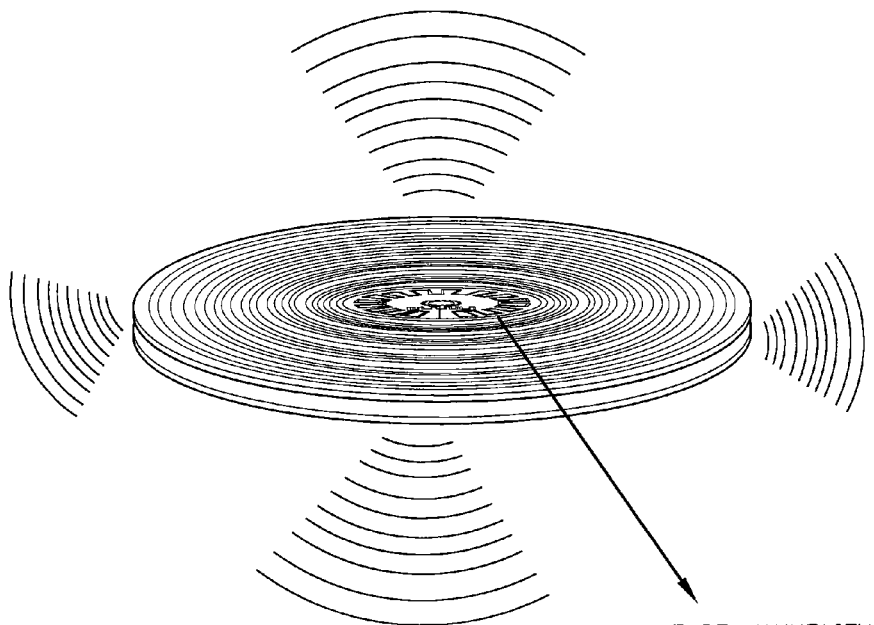
FIGS. 12A-12C show example tagged optical discs, according to embodiments of the present invention.
Figure 12B:
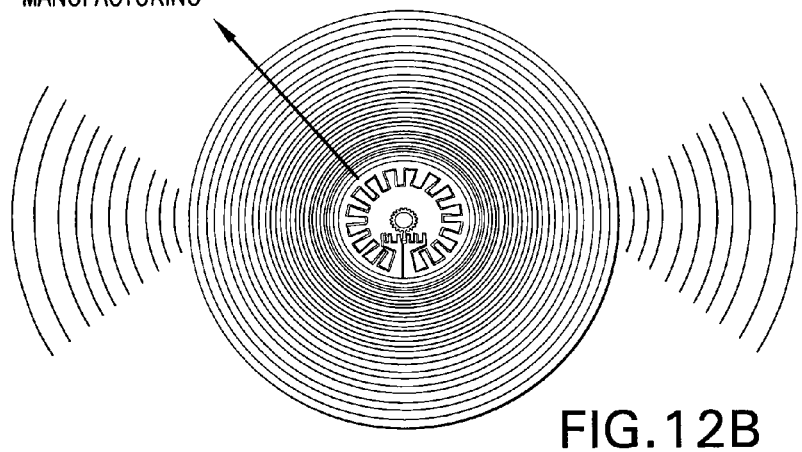
Figure 12C:
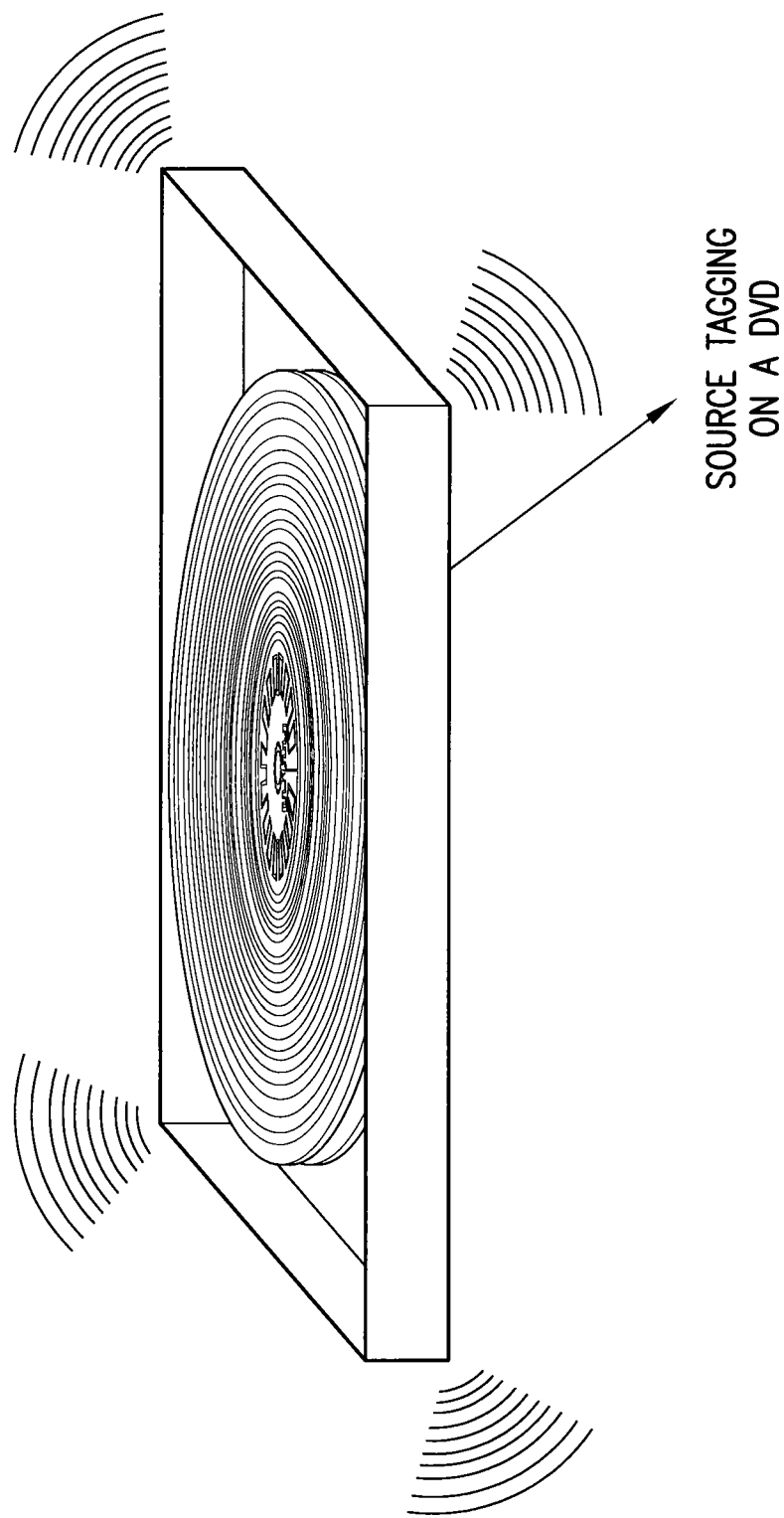

FIGS. 12A-12C show example applications for a tagged optical disc 600, according to embodiments of the present invention. For example, as shown in FIG. 12A, in an embodiment, a tag antenna can be applied between two discs that are combined, such as two DVDs. This brings the effective antenna to both the inside label and the outside edge of the disc. Furthermore, as shown in FIG. 12B, a matching circuit with die/chip can be embedded into a tamper label during manufacturing. As shown in FIG. 12C, source tagging on a disc may be done.

Note that in an example implementation, once an optical disc 600 is manufactured, it may be packaged in a shielded optical disc package. Thus, this implementation can operate as a tamper-resistant device. For example, a tagged optical disc 600 in a shielded package will not be capable of responding to an interrogation. Once the package is opened, the optical disc 600 can respond to an interrogation. Thus, if someone opens or tampers with a packaged optical disc 600 before the disc has been legitimately sold, if the optical disc 600 can be successfully interrogated, a merchant will know that the disc has been tampered with.

CONCLUSION

While various embodiments of the present invention have been described above, it should be understood that they have been presented by way of example, and not limitation. It will be apparent to persons skilled in the relevant arts that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A radio frequency identifiable disc medium, comprising:
   a disc substrate;
   a metal layer on the disc substrate including digitally encoded tracks of information;
   at least one metal trace on the disc substrate coupled to said metal layer; and
   an interposer attached to said disc substrate, said interposer including:
   an interposer substrate;
   an integrated circuit die;
   an impedance matching network patterned on said interposer substrate and coupled to said die; and
   an electrical connector that couples said die with said at least one metal trace.

2. The radio frequency identifiable disc medium of claim 1, wherein said at least one metal trace is provided on a portion of the disc substrate other than the portion including digitally encoded tracks of information and is coupled to said metal layer.

3. The radio frequency identifiable disc medium of claim 1, wherein said disc substrate has a centrally located opening, said interposer is attached to the disc substrate around the centrally located opening, said metal layer including digitally encoded tracks of information is located radially outward of said interposer, and said at least one trace is provided on a portion of the disc substrate between said interposer and said metal layer.

4. The radio frequency identifiable disc medium of claim 1, wherein said at least one metal trace includes at least a pair of opposing metal traces.

5. The radio frequency identifiable disc medium of claim 1, wherein said at least one metal trace includes a circular line portion.

6. The radio frequency identifiable disc medium of claim 1, wherein said at least one metal trace includes a radial line portion.

7. The radio frequency identifiable disc medium of claim 1, wherein said at least one metal trace includes at least one T-shaped portion including a circular line portion and a radial line portion coupled to said circular line portion.

8. The radio frequency identifiable disc medium of claim 7, wherein said at least one metal trace includes at least a pair of T-shaped metal traces.

9. The radio frequency identifiable disc medium of claim 8, wherein said at least one metal trace includes at least one opposing pair of T-shaped metal traces.

10. The radio frequency identifiable disc medium of claim 9, wherein said at least one metal trace includes two opposing pairs of T-shaped metal traces.

11. The radio frequency identifiable disc medium of claim 7, wherein said disc substrate has a centrally located opening, and said at least one metal trace includes at least two T-shaped metal traces symmetrically arranged around said centrally located opening.

12. The radio frequency identifiable disc medium of claim 1, wherein said electrical connection of said interposer includes conductive pads respectively coupled to said at least one metal trace.

13. The radio frequency identifiable disc medium of claim 1, further comprising a coating that encapsulates the metal layer, the at least one metal trace and the interposer on the disc substrate.

14. The radio frequency identifiable disc medium of claim 1, wherein said disc medium is a digital video disc (DVD).

15. The radio frequency identifiable disc medium of claim 1, wherein said disc medium is a compact disc (CD).

* * * * *